United States Patent
Hancu et al.

(10) Patent No.: US 9,645,214 B2
(45) Date of Patent: May 9, 2017

(54) SYSTEMS AND METHODS FOR DETERMINING ELECTRICAL PROPERTIES USING MAGNETIC RESONANCE IMAGING

(71) Applicant: General Electric Company, Schenectady, NY (US)

(72) Inventors: Ileana Hancu, Clifton Park, NY (US); Selaka Bandara Bulumulla, Niskayuna, NY (US); Florian Wiesinger, Bavaria (DE); Laura Irene Sacolick, Bavaria (DE); Seung Kyun Lee, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 641 days.

(21) Appl. No.: 14/095,707

(22) Filed: Dec. 3, 2013

(65) Prior Publication Data

US 2015/0153431 A1 Jun. 4, 2015

Related U.S. Application Data

(60) Provisional application No. 61/909,891, filed on Nov. 27, 2013.

(51) Int. Cl.
*G01V 3/00* (2006.01)
*G01R 33/48* (2006.01)
*G01R 33/24* (2006.01)

(52) U.S. Cl.
CPC ....... *G01R 33/4816* (2013.01); *G01R 33/246* (2013.01)

(58) Field of Classification Search
USPC ........................................................ 324/309
See application file for complete search history.

(56) References Cited

U.S. PATENT DOCUMENTS 5,995,863 A * 11/1999 Farace ............... G01R 33/4804
324/307
6,026,173 A * 2/2000 Svenson .................. A61B 5/05
324/637

(Continued)

OTHER PUBLICATIONS

Grodzki et al., "Ultrashort Echo Time Imaging Using Pointwise Encoding Time Reduction With Radial Acquisition (PETRA)", Magneto Resonance in Medicine 67:510-518 (2012),Issue Date: 2012.
Bulumulla, S.B.; Lee, S.K.; Yeo, D.T.B; Comductivity and Permittivity Imaging at 3.0 T; GE Global Research, Niskayuna, NY; 9 pgs.
Voigt, Tobias; Katscher, Ulrich; Doessel, Olaf; Quantitative Conductivity and Permittivity Imaging of the Human Brain Using Electric Properties Tomography; Magnetic Resonance in Medicine 66: 456-466 (2011).

(Continued)

*Primary Examiner* — Rodney Fuller
(74) *Attorney, Agent, or Firm* — Pabitra K. Chakrabarti (57) ABSTRACT

Systems and methods for determining electrical properties using Magnetic Resonance Imaging (MRI) are provided. One method includes applying an ultra-short echo time (TE) pulse sequence in a Magnetic Resonance Imaging (MRI) system and acquiring a complex $B_1^+ B_1^-$ quantity from an object following the application of the ultra-short TE pulse sequence, where $B_1^+$ is a complex amplitude of a transmit radio-frequency (RF) magnetic field and $B_1^-$ is a complex amplitude of a receive RF magnetic field. The method also includes estimating, with a processor, one or more electrical properties of the object using the complex amplitudes of the transmit RF magnetic field and the receive RF magnetic field.

18 Claims, 8 Drawing Sheets

(56) References Cited

U.S. PATENT DOCUMENTS

| | | | |
|---|---|---|---|
| 7,511,492 B2 | 3/2009 | Sodickson et al. | |
| 7,839,147 B2 | 11/2010 | Katscher et al. | |
| 8,030,924 B2 * | 10/2011 | Bito | G01R 33/485 |
| | | | 324/309 |
| 8,076,936 B2 | 12/2011 | Borthakur et al. | |
| 8,200,309 B2 | 6/2012 | Wollin | |
| 8,253,416 B2 | 8/2012 | Ma et al. | |
| 8,334,691 B2 | 12/2012 | Lee et al. | |
| 9,069,998 B2 * | 6/2015 | Bulumulla | G06K 9/00 |
| 2008/0001600 A1 * | 1/2008 | deCharms | G01R 33/4806 |
| | | | 324/309 |
| 2008/0129298 A1 * | 6/2008 | Vaughan | G01R 33/583 |
| | | | 324/322 |
| 2012/0139541 A1 | 6/2012 | Weiss et al. | |
| 2012/0262174 A1 | 10/2012 | Voigt et al. | |
| 2012/0271571 A1 | 10/2012 | Bulumulla et al. | |

OTHER PUBLICATIONS

Van Lier, Astrid L.H.M.W.; Brunner, David O.; Pruessmann, Klaas P.; Klomp, Dennis W.J.; Luijten, Peter R.; Lagendijk, Jan J.W.; van den Berg, Cornelis A.t.; B+1 Phase Mapping at 7T and its Application for In Vivo Electrical Conductivity Mapping; Magnetic Resonance in Medicine 67: 552-561 (2012).

Wu, Yaotang; Ackerman, Jerome L.; Chesler, David A.; Graham, Lila; Wang, Yan; Glimcher, Melvin J.; Density of Organic Matrix of Native Mineralized Bone Measured by Water- and Fat-Suppressed Proton Projection MRI; Magnetic Resonance in Medicine 50:59-68(2003).

Madio, David P.; Lowe, Irving J.; Ultra-Fast Imaging Using Low Flip Angles and FIDs; MRM 34: 525-529 (1995).

* cited by examiner

SYSTEMS AND METHODS FOR DETERMINING ELECTRICAL PROPERTIES USING MAGNETIC RESONANCE IMAGING

CROSS-REFERENCE TO RELATED APPLICATIONS

This application claims priority to and the benefit of the filing date of U.S. Provisional Application No. 61/909,891, filed on Nov. 27, 2013, entitled "Systems and Methods for Determining Electrical Properties Using Magnetic Resonance Imaging," which is hereby incorporated by reference in its entirety.

STATEMENT REGARDING FEDERALLY SPONSORED RESEARCH & DEVELOPMENT

This invention was made with Government support under 1R01CA154433-01A1 awarded by the National Institute of Health. The Government has certain rights in the invention.

BACKGROUND

MRI or Nuclear Magnetic Resonance (NMR) imaging generally provides for the spatial discrimination of resonant interactions between radio frequency (RF) waves and nuclei in a magnetic field. Specifically, MRI utilizes hydrogen nuclear spins of the water molecules in the human body, which are polarized by a strong, uniform, static magnetic field of a magnet. This magnetic field is commonly referred to as $B_0$ or the main magnetic field. When a substance, such as human tissue, is subjected to the main magnetic field, the individual magnetic moments of the spins in the tissue attempt to align with the main magnetic field. When excited by an RF wave, the spins precess about the main magnetic field at a characteristic Larmor frequency. A signal is emitted by the excited spins and processed to form an image.

A determination of tissue conductivity and permittivity in an MRI exam may be useful for a number of different purposes. For example, the determination of the electrical properties of tissue (conductivity and permittivity) is useful in estimating or simulating local RF power deposition (also known as local specific absorption rate or abbreviated as SAR) during acquisition of MR images. The electrical properties of tissue can also be useful in discriminating between malignant and healthy or benign tissue (e.g., malignant tissue has been shown to have higher permittivity and conductivity than surrounding healthy tissue). In some applications, knowledge of the electrical properties of tissue can be used during therapeutic applications of heat using radio frequency, for example, RF hyperthermia for treatment planning.

Typically, the determination of tissue conductivity and permittivity in MRI is performed using two separate MRI acquisitions, one to map the magnitude of the transmit field, and one allowing the approximation of the phase of the transmit field. This process, involving two separate MRI acquisitions, is typically slow and results in the acquisition of images with low signal to noise ratio (SNR). Moreover, the mapping of the transmit field involves an acquisition that may not exist on all clinical scanners, which has the additional drawback of being SNR inefficient.

BRIEF DESCRIPTION

In accordance with various embodiments, a non-transitory computer readable storage medium for estimating electrical properties of an object using a processor is provided. The non-transitory computer readable storage medium includes instructions to command the processor to apply an ultra-short echo time (TE) pulse sequence in a Magnetic Resonance Imaging (MRI) system and acquire a complex $B_1^+B_1^-$ quantity from an object following the application of the ultra-short TE pulse sequence, where $B_1^+$ is a complex value of a transmit radio-frequency (RF) magnetic field and $B_1^-$ is a complex value of a receive RF magnetic field. The non-transitory computer readable storage medium includes instructions to further command the processor to estimate one or more electrical properties of the object using the complex values of the transceive field $B_1^+B_1^-$.

In accordance with other various embodiments, a method for non-invasively imaging tissue properties is provided. The method includes applying an ultra-short echo time (TE) pulse sequence in a Magnetic Resonance Imaging (MRI) system and acquiring a complex $B_1^+B_1^-$ quantity from an object following the application of the ultra-short TE pulse sequence, where $B_1^+$ is a complex amplitude of a transmit radio-frequency (RF) magnetic field and $B_1^-$ is a complex amplitude of a receive RF magnetic field. The method also includes estimating, with a processor, one or more electrical properties of the object using the complex amplitudes of the transmit RF magnetic field and the receive RF magnetic field.

In accordance with yet other various embodiments, a Magnetic Resonance Imaging (MRI) system is provided that includes an imaging portion configured to generate an MRI transmit $B_1^-$ radio-frequency (RF) magnetic field using one or more transmitters by applying an ultra-short echo time (TE) pulse sequence to one or more coils, and acquire receive magnetic resonance (MR) $B_1^-$ RF data from an object using one or more receivers, where $B_1^-$ is a complex amplitude of the transmit RF magnetic field and $B_1^-$ is a complex amplitude of the receive RF magnetic field. The MRI system also includes a processing portion having an electrical properties estimation module configured to estimate electrical properties of the object by acquiring a complex $B_1^+B_1^-$ quantity resulting from the ultra-short TE pulse sequence.

DETAILED DESCRIPTION

The following detailed description of certain embodiments will be better understood when read in conjunction with the appended drawings. To the extent that the figures illustrate diagrams of the functional blocks of various embodiments, the functional blocks are not necessarily indicative of the division between hardware. Thus, for example, one or more of the functional blocks may be implemented in a single piece of hardware or multiple pieces of hardware. It should be understood that the various embodiments are not limited to the arrangements and instrumentality shown in the drawings. Additionally, the system blocks in the various figures or the steps of the methods may be rearranged or reconfigured.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide for the estimation (or determination) of electrical properties (e.g., in clinically acceptable time frames for routine clinical use) of a subject using Magnetic Resonance Imaging (MRI). For example, various embodiments allow for the reconstruction and/or determination of tissue conductivity and permittivity. In some embodiments, a single, three-dimensional (3D), ultra-short echo time acquisition is used to reconstruct tissue conductivity and permittivity. At least one technical effect of various embodiments is a very short (or zero) echo time, with no significant signal de-phasing due to chemical shift. At least one other technical effect of various embodiments is that no significant eddy currents are generated. At least one other technical effect of various embodiments is a faster and more signal-to-noise ratio (SNR) efficient process, leading to better reconstruction of tissue electrical properties.

In various embodiments, both the magnitude and the phase of the signal acquired with the single, 3D acquisition can be used for reconstructing conductivity and permittivity. Accordingly, in various embodiments, the computation or reconstruction of tissue electrical properties (TEPs) with a single MRI acquisition (e.g., a single pulse sequence) is used to extract tissue conductivity and permittivity information. As described in more detail herein, in various embodiments, using a 3D ultra-short TE MRI acquisition, the complex values of the transceiver field are used to compute TEP maps. In some embodiments, a single pulse sequence is used, for example, a single pulse sequence for permittivity and conductivity reconstruction is used wherein the sequence is gradient echo. By practicing various embodiments, minimal or reduced de-phasing is provided due to spin evolution from the chemical shift or $B_0$ inhomogeneities.

Figure 1:
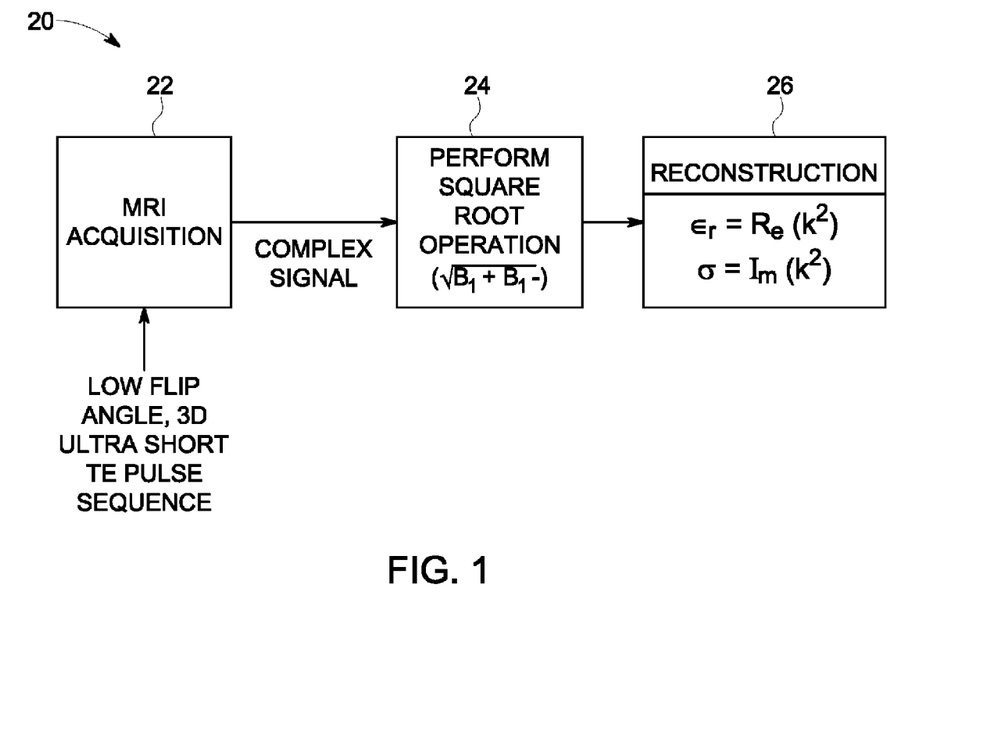
FIG. 1 is a block diagram illustrating a tissue electrical property (TEP) mapping process in accordance with various embodiments.

FIG. 1 illustrates one embodiment of a TEP mapping process that uses a single MRI acquisition to determine tissue conductivity and permittivity information. A more detailed discussion of specific embodiments follows the general description. The TEP mapping process 20 in one embodiment is based on a reformulation of Hemholtz's equations to approximate relative permittivity ($\epsilon_r$) and conductivity ($\sigma$). In particular, the mapping process 20 is used to measure the complex value of the transceive field $B_1^+B_1^-$ from one or more receive channels. In one embodiment, a MRI acquisition using a 3D, ultra-short (also referred to herein as ultra-fast) TE, low flip angle acquisition is performed at 22. The complex signal resulting from this acquisition is proportional to the transceive field $B_1^+B_1^-$. A square root operation is performed in step 24 on the complex signal acquired at 22. The permittivity and conductivity are reconstructed in step 26.

For example, an ultra-short echo time (TE) pulse sequence may be applied to one or more coils of a Magnetic Resonance Imaging (MRI) system to acquire a complex signal, which in the low flip angle approximation is proportional to the product $B_1^+B_1^-$. In this example, $B_1^+$ is the complex transmit radio-frequency (RF) magnetic field and $B_1^-$ is the complex receive RF magnetic field. As described in more detail herein, a magnitude and a phase of the $B_1^+B_1^-$ quantity are determined and one or more electrical properties of the object estimated using the determined magnitude and phase.

Figure 2:
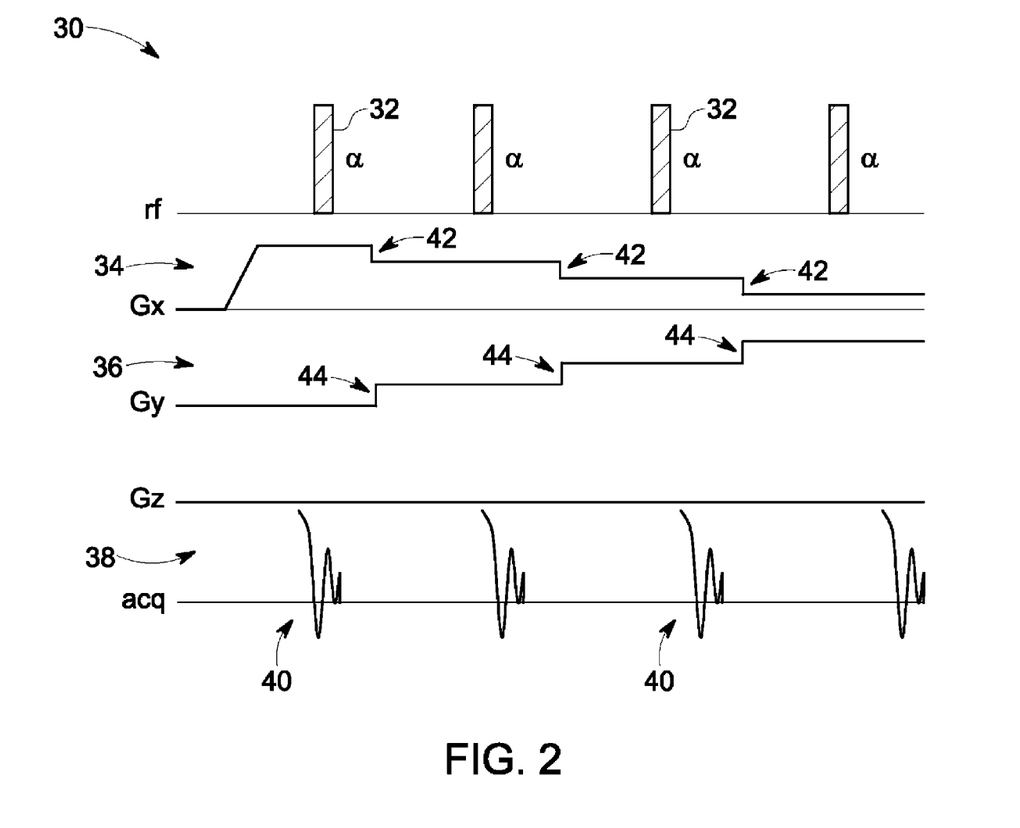
FIG. 2 is a diagram illustrating a pulse sequence in accordance with an embodiment.

FIG. 2 illustrates a pulse sequence 30 that may be used in accordance with various embodiments. As can be seen, the pulse sequence 30 includes a plurality of short excitation pulses 32, which in various embodiments are RF pulses having a short pulse width, such as less than $1/BW_{readout}$. The excitation pulses 32 are applied during the time in which gradient pulses 34, 36, 38, and 40 are on. These gradients encode the spatial information and enable image formation. It should be noted that the pulse sequence 30 uses a 3D radial center-out k-space sampling with generally constant imaging gradients and no ramping, except for small incremental directional updates 42 and 44. The limited ramping of gradients during the imaging process has the desirable effect of producing very limited or no eddy currents in various embodiments.

However, it should be noted that different pulse sequences 30 and gradient pulse schemes may be used. Examples of different pulse sequences for acquisitions include a rotating ultra-fast imaging sequence (RUFIS) (such as described in *Ultra-Fast Imaging Using Low Flip Angles and FIDs*, Madio et al, Magn Reson Med 34:525-529, 1995), a back-projection reconstruct low angle Shot (BLAST) sequence (such as described in *Fast Imaging in Liquids and Solids wit the Back-projection Low Angle ShoT (BLAST) Technique*, Hafner, Magn Reson Imaging, 12:1047-1051, 1994), a water- and fat-suppressed proton projection MRI (WASPI) sequence (such as described in *Density of organic matrix of native mineralized bone measured by water and fat suppressed proton projection MRI*, Wu et al, Magn Reson Med 50: 59-68, 2003), or a Zero TE sequence (such as described in *MRI with Zero Echo Time" hard versus Sweep Pulse Excitation*, Weiger at al., Magn Reson Med 66:379-389, 2011), among others.

Thus, using the pulse sequence at 22 for MRI acquisition (as shown in FIG. 1), magnitude and phase information is acquired at 24. In particular, using the pulse sequence at 22, a low flip, ultra-short TE acquisition is performed to extract the complex $B_1^+B_1^-$ quantity (complex number having real and imaginary components), which includes both the magnitude and phase of the quantity of interest ($\sqrt{B_1^+B_1^-}$), which is obtained in one acquisition (e.g., single pulse sequence in some embodiments). The $B_1^+$ ($B_1^-$) quantity is the complex amplitude of the transmit (receive) RF magnetic field inside the tissue with electrical properties of $\mu$ (magnetic permeability), $\epsilon_r$ (relative permittivity), $\sigma$ (conductivity) at a frequency $\omega=2\pi f$. Accordingly, $B_1^+$ represents the complex amplitude of the radio frequency (RF) transmit magnetic field inside the tissue at a given three dimensional location and $B_1^-$ represents the complex amplitude of the RF receive magnetic field inside the tissue at the given three dimensional location.

It should be noted that various embodiments estimate electrical properties of tissue using a "transceive" amplitude and a "transceive" phase, where "transceive" refers to a term that includes both the transmit RF magnetic field $B_1^+$ and the receive RF magnetic field $B_1^-$. For example, in various embodiments, the transceive magnitude can be directly proportional to an intensity of a low flip angle gradient echo MR image, proportional to the product of the transmit RF field and the receive RF field ($B_1^+B_1^-$), wherein the transceive phase can be phase of the image, proportional to the sum of the phases of the transmit RF field and the receive RF field.

As described in more detail herein, using the acquired complex $B_1^+B_1^-$ quantity, the permittivity and conductivity may be determined at 26. In particular, the permittivity is determined from the real portion (Re) of the complex ($\sqrt{B_1^+B_1^-}$) quantity and the conductivity is determined from the imaginary portion (Im) of the complex ($\sqrt{B_1^+B_1^-}$) quantity.

More particularly, tissue permittivity and electrical conductivity are related to the spatial distribution of the RF magnetic field by the following equations:

$$\nabla^2 B_1^+ + k^2 B_1^+ = 0 \qquad (1)$$

$$\nabla^2 B_1^- + k^2 B_1^- = 0 \qquad (2)$$

where $$k^2 = \mu \varepsilon_r \varepsilon_0 \omega^2 - i\mu\sigma\omega \qquad (3)$$

Again, $B_1^+$ ($B_1^-$) is the complex amplitude of the transmit (receive) RF magnetic field inside the tissue with electrical properties of $\mu$ (magnetic permeability), $\varepsilon_r$ (relative permittivity), $\sigma$ (conductivity) at frequency $\omega=2\pi f$. It should be noted that with respect to tissue electrical property mapping, the magnetic permeability can be equated to the value in vacuum, $\mu_0 = 4\pi \times 10^{-7}$ [H/m], with the constant $\varepsilon_0 = 8.854 \times 10^{-12}$ [F/m] being the permittivity of vacuum.

Equations 1 and 2 may be modified as follows:

$$\frac{\nabla^2 \sqrt{B_1^+ B_1^-}}{\sqrt{B_1^+ B_1^-}} + k^2 + k_{error}^2 = 0 \qquad (4)$$

with $$k_{error}^2 \equiv \frac{1}{4} \nabla \ln \frac{B_1^-}{B_1^+} \cdot \nabla \ln \frac{B_1^-}{B_1^+} \qquad (5)$$

The first term of Equation 4 represents the fractional Laplacian of the square root of the product of the RF transmit and receive fields ($B_1^+B_1^-$), where $\nabla^2$ (_) is the Laplace operator. The first term (i.e., the fractional Laplacian) depends on a measureable quantity, namely the complex signal acquired from the single low-flip-angle echo image. The third term is typically not directly measureable. However, in cases where this term is small compared to the wavevector $k^2$, the electrical properties of tissue can be estimated by ignoring the third term and solving for $\varepsilon_r$ and $\sigma$ as described in more detail herein.

In particular, in various embodiments, by ignoring the error term defined by Equation 5, the electrical properties may be reconstructed or determined using the following equations:

$$\varepsilon_r \approx -\frac{1}{\mu \varepsilon_0 \omega^2} \text{Re}\left(\frac{\nabla^2 \sqrt{B_1^+ B_1^-}}{\sqrt{B_1^+ B_1^-}}\right) \qquad (6)$$

$$\sigma \approx -\frac{1}{\mu\omega} \text{Im}\left(\frac{\nabla^2 \sqrt{B_1^+ B_1^-}}{\sqrt{B_1^+ B_1^-}}\right) \qquad (7)$$

Figure 3:
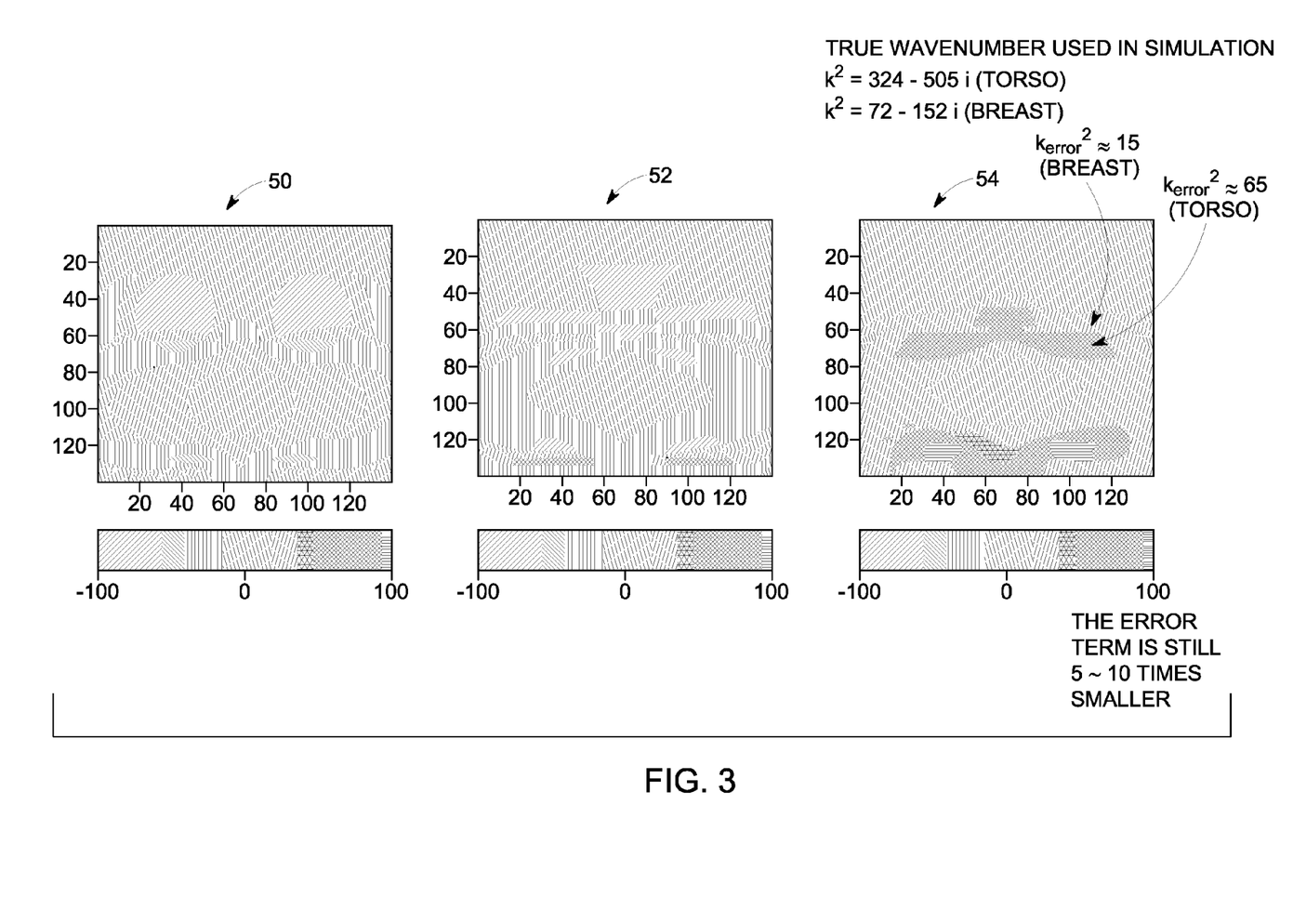
FIG. 3 is a diagram illustrating an error term in accordance with various embodiments.

The error term in Equation 5 is small compared to the value of $k^2$ in many instances with respect to different anatomy. For example, for the brain, the error term is about 1% of $k^2$ (determined using finite element electromagnetic simulations using model properties: Brain conductivity=0.54 S/m, Muscle (outer layer) conductivity=0.74 S/m, Brain permittivity=67.93 and Muscle (outer later) permittivity=64.7). For torso and breast, the error term is about 5 to 10 times smaller than $k^2$ (these results were obtained using finite element electromagnetic simulations, with torso conductivity=0.5 S/m, Breast conductivity=0.15 S/m, Torso permittivity=45 and Breast permittivity=10). For example, FIG. 3 illustrates maps 50, 52 and 54 of the real, imaginary and absolute value of the K error. In this simulation, the true wavenumber used in the simulation for the torso is $k^2$=324-505 i for the torso and $k^2$=72-152 i for the breast. The corresponding $k_{error}^2$ is about 65 for the torso and about 15 for the breast.

In the case of a small-flip-angle gradient echo image, the image intensity satisfies the following equation:

$$|I_{GRE}| = I_0 |B_1^+ B_1^-|. \qquad (8)$$

where $I_0$ is a constant that depends on the tissue under study and is independent of the electrical properties and the RF field. Accordingly, the magnitude of the intensity of the gradient echo image ($I_{GRE}$) is equal to the magnitude of the product of the transmit RF field and the receive RF field multiplied by $I_0$.

Moreover, if there is no spin de-phasing due to chemical shift or eddy currents, then:

$$\angle I_{GRE} = \angle (B_1^+ B_1^-). \qquad (9)$$

Thus, various embodiments use a single low flip angle, 3D, ultra-short TE acquisition to extract the complex $B_1^+B_1^-$ quantity. The acquisition generally has a very short echo time (e.g., below 1 millisecond is some embodiments, and under 100 microseconds in some embodiments), uses short excitations (e.g., 12 microseconds) and only incremental gradient updates. Such acquisition has a very high SNR/time efficiency.

Figure 4:
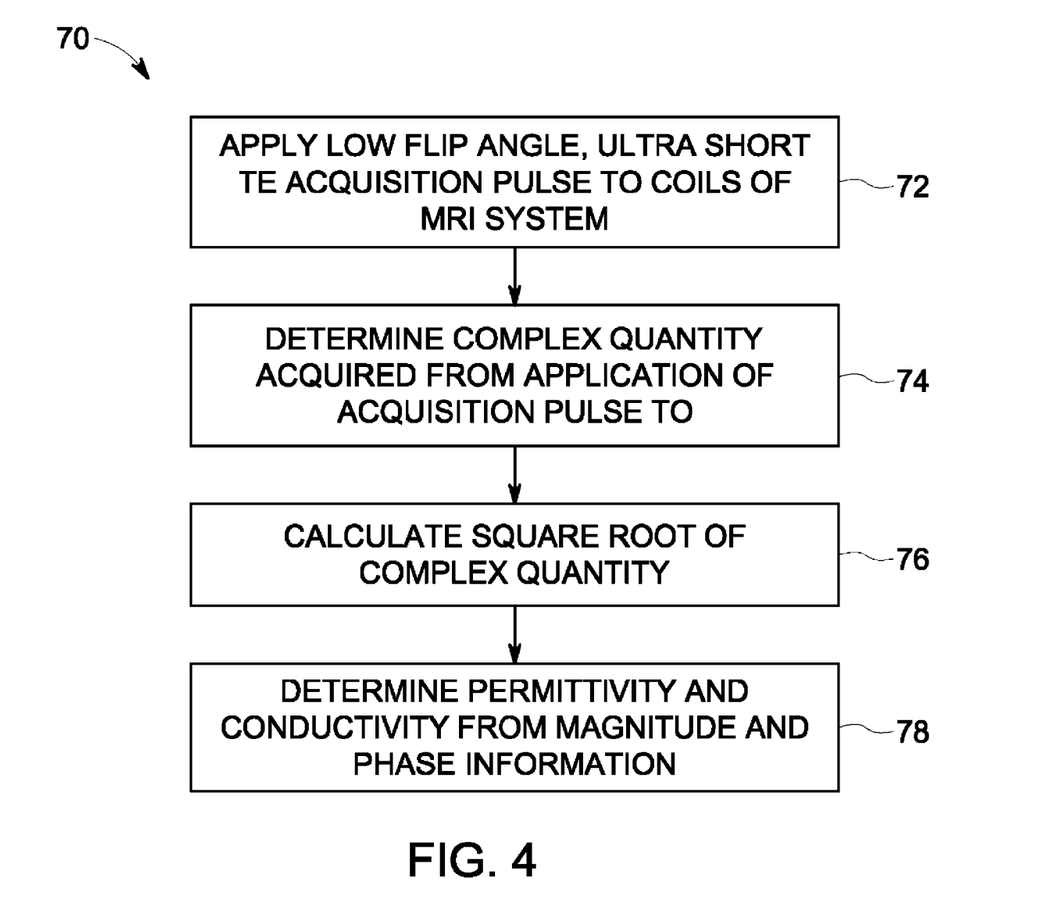
FIG. 4 is a flowchart of a method for permittivity and conductivity mapping in accordance with various embodiments.

For example, FIG. 4 is a flowchart of a method 70 in accordance with various embodiments for permittivity and conductivity mapping. The method 70 includes applying a low flip angle, ultra-short TE acquisition pulse to one or more coils of an MRI system. In some embodiments, a single pulse sequence is used to acquire a complex value of the transceive field generated by the transmit and receive coils. For example, in various embodiments, a complex $B_1^+B_1^-$ quantity is determined at 74 using MRI imaging techniques in the art, wherein the transceive field is generally defined by two vectors rotating in opposite directions, usually in a plane transverse to $B_0$. At the Larmor frequency, the vector rotating in the same direction as the precessing spins will interact strongly with the spins.

Using this complex $B_1^+B_1^-$ quantity, the square root of this complex number is computed in step 76. Thus, the square root of the transceive field is extracted. For example, the magnitude of the images acquired using a low flip angle, 3D, ultra-short TE acquisition is proportional to the product $B_1^+B_1^-$. It should be noted that the short echo time of such acquisition (e.g., ~0-100 microseconds) allows minimal spin de-phasing due to chemical shift. The minimal gradient switching induces no significant eddy currents. Accordingly, the phase of this acquisition is equal to the sum of the phases of the transmit and receive field.

Thus, following the completion of a single scan using a 3D, ultra-short TE, low flip angle acquisition, all the information to compute the tissue electrical properties (according to Equations 6 and 7) is obtained and the computation may be performed at 78. For example, the tissue permittivity and conductivity determined from the magnitude and phase information may be determined using Equations 6 and 7. In some embodiments, a square root operation is performed on the complex, 3D data set obtained at the end of the acquisition to compute the complex $\sqrt{B_1^+B_1^-}$ quantity. The electrical properties of interest (e.g., permittivity and conductivity) are then computed using Equations 6 and 7.

It should be noted that as a result of the data being acquired in a 3D manner, no small jumps in magnitude or phase occur between slices due to hardware or acquisition imperfections (as can appear when a 2D acquisition is used for the acquisition of either the magnitude and phase of the quantity of interest ($\sqrt{B_1^+B_1^-}$ or $B_1^+$)).

Thus, in accordance with various embodiments, the tissue electrical properties can be estimated in vivo, using a single 3D, SNR efficient acquisition, having limited or reduced acquisition time. Additionally, there is no (or minimal) correction for slice to slice phase or magnitude imperfections that would appear, should any of the data be acquired using 2D sequences. Also, no additional noise is brought into the computation of tissue electrical properties by mixing of (magnitude and phase) data from two separate acquisitions, with potentially different SNR.

Figure 5:
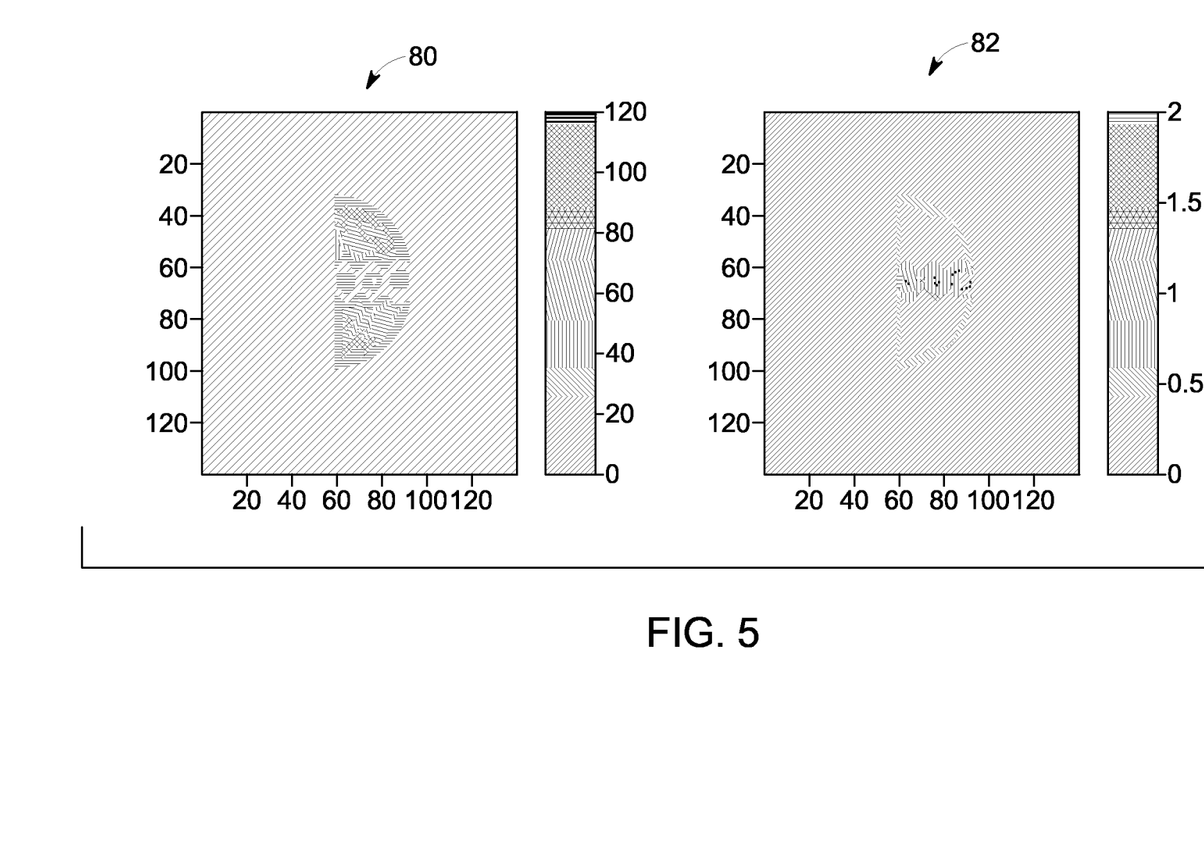
FIG. 5 are images of permittivity and conductivity contrast maps generated in accordance with various embodiments.

FIG. 5 illustrates permittivity and conductivity contrast maps 80 and 82, respectively, obtained using various embodiments on a phantom consisting of salt water spheres with different salt concentrations. The maps 80 and 82 are of a half sphere phantom with three spherical inclusions that are relatively small, with a volume of about 8 milliliters. As can be seen, the various embodiments can identify inclusions with different electrical properties with reasonable (e.g., clinically acceptable) spatial resolution.

Table 1 below illustrates the measured values for conductivity at 200 MHz using in vitro, probe measurements, and the average values from the four compartments in the phantom (measured at 128 MHz). While conductivity increases with frequency, the differences between the measured values at 200 MHz using a probe and the ones measured through MRI at 128 MHz are probably not entirely explained by the frequency difference. It should be noted, however, the very high correlation between the MRI based measurements and the probe measurements (Pearson correlation coefficient r=0.998, p=0.002), indicate the high capability of MRI based measurements to provide adequate conductivity measurements (e.g., clinically useful measurements)

TABLE 1

| Compartment | NaCl | Measured (200 MHz) σ | Measured (MRI) (128 MHz) σ |
| --- | --- | --- | --- |
| Outer | 0.5 g/L | 0.16 (S/m) | 0.12 (S/m) |
| Top | 9 g/L | 1.45 (S/m) | 1.12 (S/m) |
| Center | 5 g/L | 0.87 (S/m) | 0.61 (S/m) |
| Bottom | 3.7 g/L | 0.65 (S/m) | 0.49 (S/m) |

Figure 6:
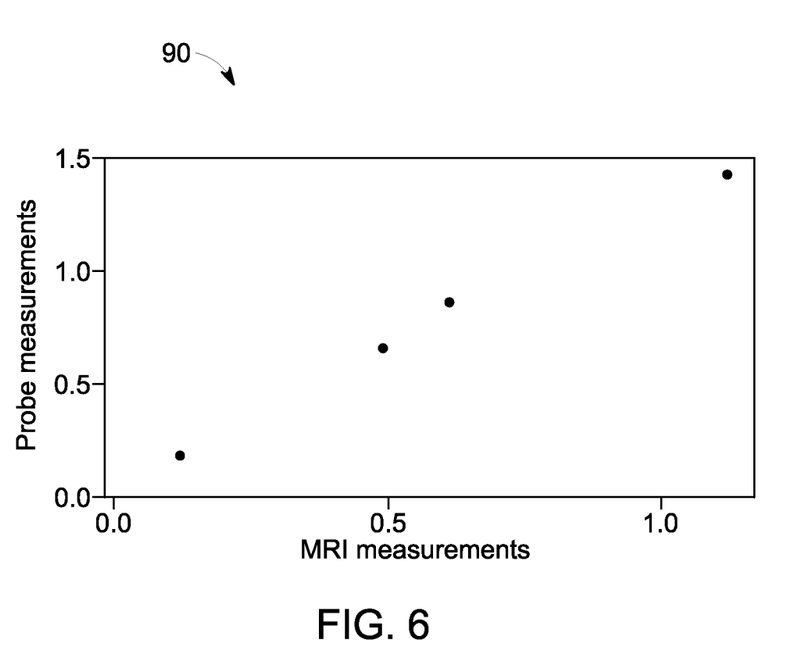
FIG. 6 is a graph of a plot of conductivity measurements.

For example, the graph 90 of FIG. 6 is a plot of the data in Table 1, in particular, a plot of conductivity using probe measurements (200 MHz) versus RUFIS based measurements (128 MHz) in accordance with various embodiments. In the graph 90, the horizontal axis corresponds to the MRI measurements and the vertical axis corresponds to the probe measurement. It should be noted that for small regions of interest, the conductivity measurements work better than permittivity measurements due to reduced boundary/contrast effects in the phase data than in the magnitude data.

It also should be noted that the computation of the Laplacian was done using a quadratic fit, using three (phantom) and five (in vivo) additional points on each side of the pixel of interest. No additional data filtering was performed. The water based, half sphere conductivity phantom containing the three small spheres, of ~8 ml volume defined four compartments having conductivities of 0.16/0.65/0.87/1.45 S/m for the outer/bottom/middle/top compartment, respectively. These conductivity measurements were performed at 200 MHz, yielding slightly larger values than the ones that would be measured at 128 MHz. The imaging parameters chosen for all data acquisition are: cubical FOV=28 cm, acquisition matrix=128 pts, flip angle=2-3°, BW=31 kHz, TE=12 μs, NEX=16, scan time ~7.2 min. The measurements were performed using a 3T, Discovery MR750 scanner (available from GE Healthcare, Waukesha, Wis.) using a transmit/receive birdcage coil.

Figure 7:
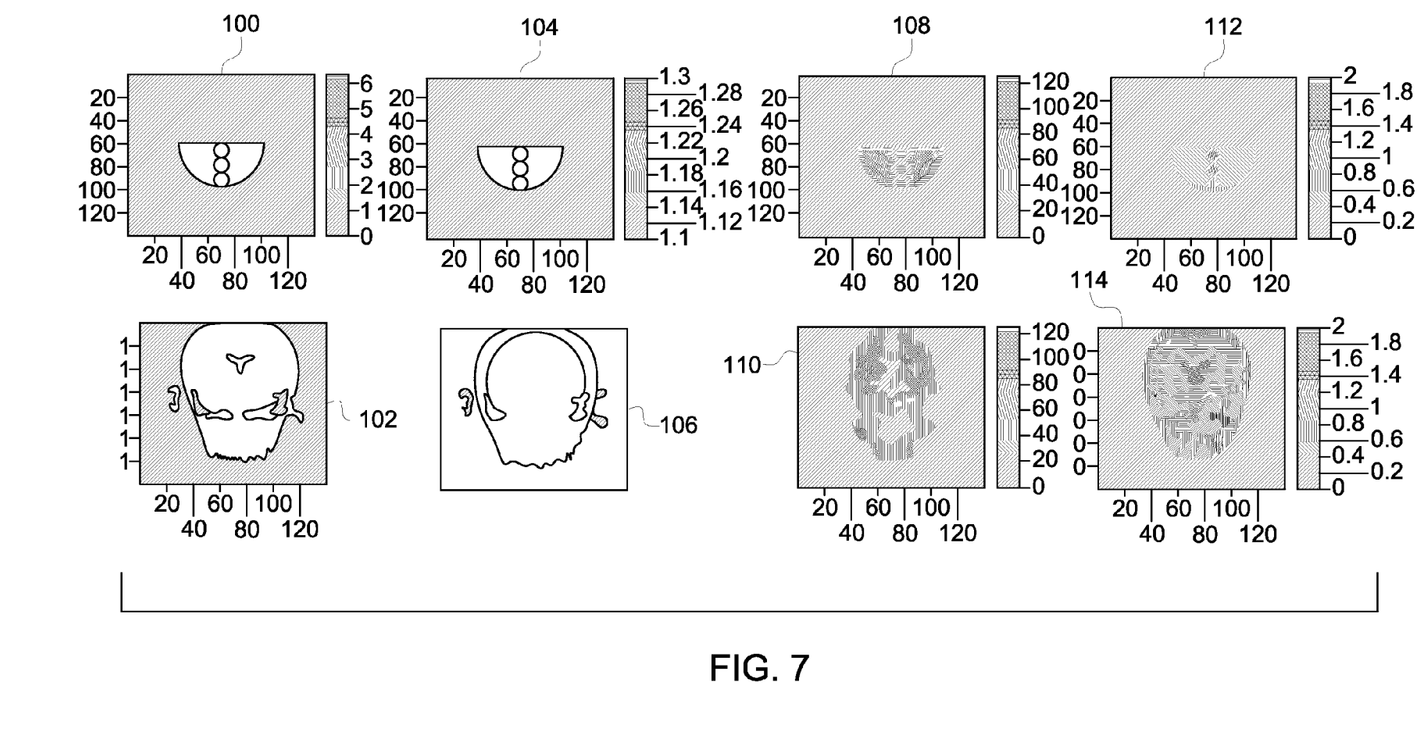
FIG. 7 are images of magnitude and phase, and permittivity and conductivity contrast maps generated in accordance with various embodiments.

FIG. 7 shows one slice of the magnitude and phase of the data (illustrated by images 100, 102 and 104, 106, respectively), as well as the permittivity and conductivity reconstructions (illustrated by images 108, 110 and 112, 114, respectively) for the phantom (images 100, 104, 108 and 112) as described herein and in vivo experiments (images 102, 106, 110 and 114). Permittivity values close to ~80 r e are obtained for the outer compartment of the phantom. Computation of a second derivative through a step function (visible in the magnitude data at the transition between compartments) leads to unrealistically high permittivity values near that transition. The smoothness of phase data among different compartments (only less than 0.01 radians difference exist between compartments) leads to good conductivity estimates.

Thus, various embodiments provide systems and methods allowing conductivity and permittivity mapping from a single 3D data set. Using an ultra-short TE acquisition (which increases or maximizes SNR efficiency and decreases or minimizes unwanted phase changes due to chemical shift and $B_0$ inhomogeneities) and reduced or minimal gradient switching (to reduce eddy current induced phase changes), a 3D pulse sequence as described herein provides accurate mapping of TEPs.

In various embodiments, the low flip angle allows use the approximation sin(alpha)=alpha. Accordingly, in some embodiments, a low flip angle is an alpha lower than 30 degrees. However, it should be appreciated that other values may be used. Additionally, for example, to reduce or minimize de-phasing due to spin evolution under chemical shift or $B_0$ inhomogeneities during TE, assuming delta $B_0$ is 500

Hz, then in various embodiments the echo time in less than or equal to 200 microseconds. However, it should be appreciated that different echo times may be provided, such as based on a different $B_0$.

It should be noted that various embodiments may be performed while transmitting with one (quadrature) coil and receiving with the same coil. In operation, the error term is small. However, in some embodiments, operation includes transmitting with multiple transmitters (e.g., parallel transmit operation), and receiving with multiple receivers. In this case, the error term may increase. However, receiving with a receive array will have a higher SNR than when receiving with one quadrature coil.

It should be noted that the various embodiments may be used to determine the electrical properties of different regions of a subject. Accordingly, although certain regions are described herein, other regions may be imaged and the electrical properties estimated in accordance with the various embodiments.

Figure 8:
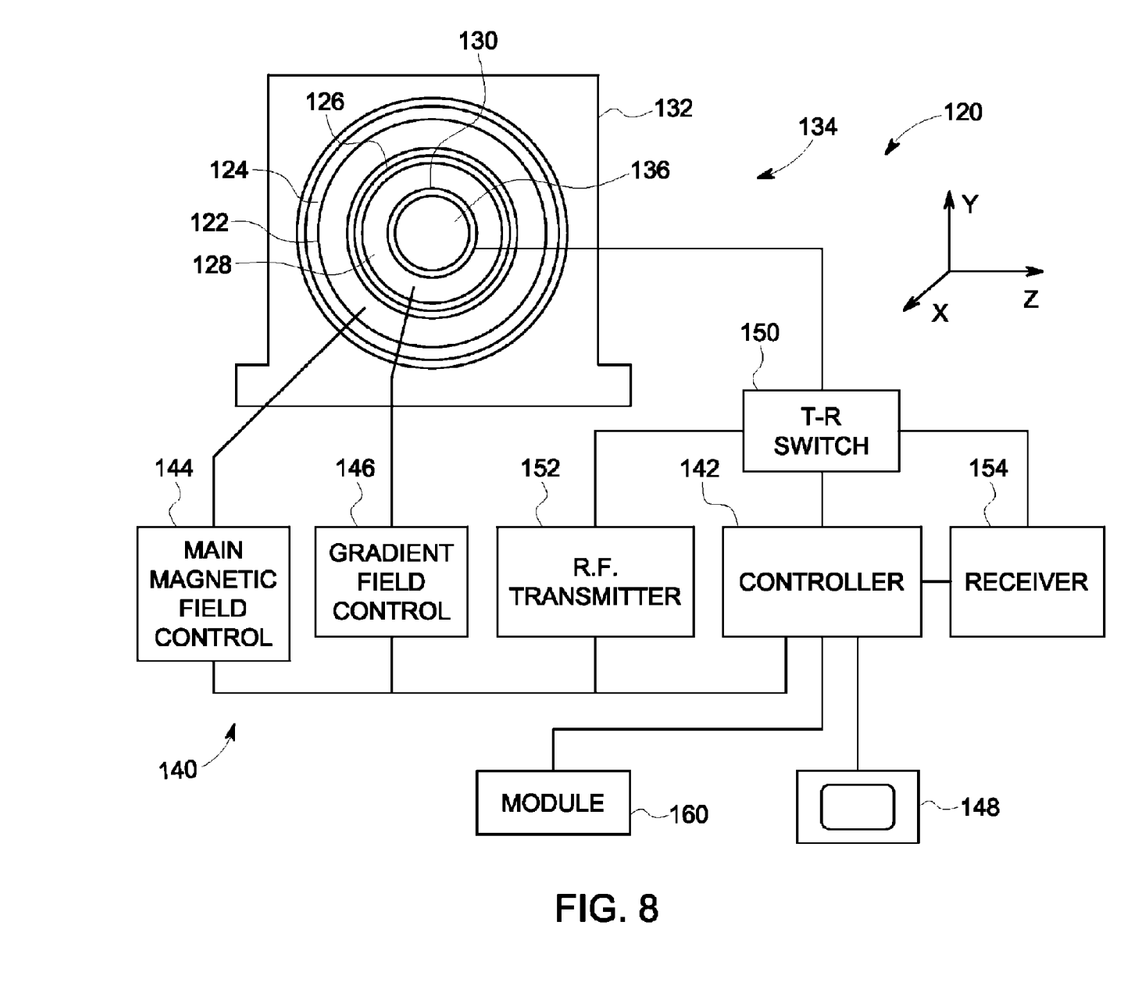
FIG. 8 is a block diagram of an MRI system formed in accordance with various embodiments.

Accordingly, various embodiments provide a non-invasive method to image tissue conductivity and permittivity. The resulting images may be used, for example, in the diagnosis of tissue abnormality, in addition to generating information to estimate heating effects due to RF. For example, an MRI system 120 as shown in FIG. 8, may be used to acquire MRI data and determine electrical properties of tissue using a single ultra-short TE acquisition. Thus, the MRI system 120 may be utilized to implement the method 70 described herein (shown in FIG. 4). In the exemplary embodiment, the MRI system 120 includes a superconducting magnet 122 formed from magnetic coils that may be supported on a magnet coil support structure. However, in other embodiments, different types of magnets may be used, such as permanent magnets or electromagnets. A vessel 124 (also referred to as a cryostat) surrounds the superconducting magnet 122 and is filled with liquid helium to cool the coils of the superconducting magnet 122. A thermal insulation 126 is provided surrounding the outer surface of the vessel 124 and the inner surface of the superconducting magnet 122. A plurality of magnetic gradient coils 128 are provided within the superconducting magnet 122 and a transmitter, for example, an RF transmit coil 130 is provided within the plurality of magnetic gradient coils 128. In some embodiments the RF transmit coil 130 may be replaced with a transmit and receive coil defining a transmitter and receiver.

The components described above are located within a gantry 132 and generally form an imaging portion 134. It should be noted that although the superconducting magnet 122 is a cylindrical shaped, other shapes of magnets can be used.

A processing portion 140 generally includes a controller 142, a main magnetic field control 144, a gradient field control 146, a display device 148, a transmit-receive (T-R) switch 150, an RF transmitter 152 and a receiver 154. In the exemplary embodiment, an electrical properties estimation module 160, which may be implemented as a tangible non-transitory computer readable medium, is programmed to determine electrical properties of a subject as described in more detail herein.

In operation, a patient is inserted into a bore 136 of the MRI system 120. The superconducting magnet 122 produces an approximately uniform and static main magnetic field $B_0$ across the bore 136. The strength of the electromagnetic field in the bore 136 and correspondingly in the patient, is controlled by the controller 142 via the main magnetic field control 144, which also controls a supply of energizing current to the superconducting magnet 122.

The magnetic gradient coils 128, which include one or more gradient coil elements, are provided so that a magnetic gradient can be imposed on the magnetic field $B_0$ in the bore 136 within the superconducting magnet 122 in any one or more of three orthogonal directions x, y, and z. The magnetic gradient coils 128 are energized by the gradient field control 146 and are also controlled by the controller 142, for example, as described herein.

The RF transmit coil 130, which may include a plurality of coils (e.g., resonant surface coils), is arranged to transmit radio-frequency pulses (for example, as described herein) and/or optionally simultaneously detect MR signals from the patient if receivers, such as receive coil elements are also provided, such as a surface coil (not shown) configured as an RF receive coil. The RF transmit coil 130 and the receive surface coil are selectably interconnected to one of the RF transmitter 152 or the receiver 154, respectively, by the T-R switch 150. The RF transmitter 152 and T-R switch 150 are controlled by the controller 142 such that RF field pulses or signals are generated by the RF transmitter 152 and selectively applied to the patient for excitation of magnetic resonance in the patient.

Following application of the RF pulses, the T-R switch 150 is again actuated to decouple the RF transmit coil 130 from the RF transmitter 152. The detected MR signals are in turn communicated to the controller 142. The detected signals are then utilized to determine electrical properties of the object (e.g., patient) being imaged. The processed signals representative of an image are also transmitted to the display device 148 to provide a visual display of the image.

The various embodiments may be implemented in connection with different types of superconducting coils, such as superconducting coils for an MRI system. For example, the various embodiments may be implemented with superconducting coils for use with an MRI system 120 shown in FIG. 9. It should be appreciated that although the system 120 is illustrated as a single modality imaging system, the various embodiments may be implemented in or with multi-modality imaging systems. The system 120 is illustrated as an MRI imaging system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as an optical disk drive, solid state disk drive (e.g., flash RAM), and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), application specific integrated circuits (ASICs), field-programmable gate arrays (FPGAs), graphical processing units (GPUs), logic circuits, and any other circuit or processor capable of executing the functions described herein. The above examples are exemplary only, and are thus not intended to limit in any way the definition and/or meaning of the term "computer".

As used herein, the terms "system," "unit," or "module" may include a hardware and/or software system that operates to perform one or more functions. For example, a module, unit, or system may include a computer processor, controller, or other logic-based device that performs operations based on instructions stored on a tangible and non-transitory computer readable storage medium, such as a computer memory. Alternatively, a module, unit, or system may include a hard-wired device that performs operations based on hard-wired logic of the device. The modules or units shown in the attached figures may represent the hardware that operates based on software or hardwired instructions, the software that directs hardware to perform the operations, or a combination thereof.

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments. The set of instructions may be in the form of a software program, which may form part of a tangible non-transitory computer readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, the embodiments are by no means limiting and are exemplary embodiments. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A non-transitory computer readable storage medium for estimating electrical properties of an object using a processor, the non-transitory computer readable storage medium including instructions to command the processor to:
   apply, via one or more coils, an ultra-short echo time (TE) pulse sequence in a Magnetic Resonance Imaging (MRI) system;
   acquire, via one or more receivers, a complex $B_1^+B_1^-$ quantity from an object following the application of the ultra-short TE pulse sequence, where $B_1^+$ is a complex value of a transmit radio-frequency (RF) magnetic field and $B_1^-$ is a complex value of a receive RF magnetic field;
   estimate one or more electrical properties including a permittivity and conductivity of the object using the complex values of the transceive field $B_1^+B_1^-$; and
   reconstruct an image of the permittivity and conductivity of the object using the estimated one or more electrical properties, wherein the image is reconstructed using a single MRI acquisition.

2. The non-transitory computer readable storage medium of claim 1, wherein the instructions command the processor to estimate the one or more electrical properties using the following:
   For permittivity $$\varepsilon_r \approx -\frac{1}{\mu\varepsilon_0\omega^2}\text{Re}\left(\frac{\nabla^2\sqrt{B_1^+B_1^-}}{\sqrt{B_1^+B_1^-}}\right)$$

For conductivity $$\sigma \approx -\frac{1}{\mu\omega}\text{Im}\left(\frac{\nabla^2 \sqrt{B_1^+ B_1^-}}{\sqrt{B_1^+ B_1^-}}\right)$$

where $k^2$ is a complex wave vector, Re is the real component of the complex $B_1^+ B_1^-$ quantity, Im is the imaginary component of the complex $B_1^+ B_1^-$ quantity, $B_1^+$ is the complex amplitude of the transmit RF magnetic field at a given three dimensional location and $B_1^-$ is the complex amplitude of the receive RF magnetic field.

3. The non-transitory computer readable storage medium of claim 1, wherein the instructions command the processor to produce the ultra-short TE pulse sequence as the rotating ultra-fast imaging sequence (RUFIS).

4. The non-transitory computer readable storage medium of claim 1, wherein the instructions command the processor to use as the ultra-short TE pulse sequence a pulse sequence having an echo time below 1 millisecond, non-selective excitations of about 12 microseconds and incremental gradient updates.

5. The non-transitory computer readable storage medium of claim 1, wherein the instructions command the processor to determine a tissue abnormality using the image of the permittivity and conductivity reconstructed using the one or more estimated electrical properties.

6. The non-transitory computer readable storage medium of claim 1, wherein the instructions command the processor to calculate a $\sqrt{B_1^+ B_1^-}$ complex quantity to estimate the one or more electrical properties of the object.

7. A method for non-invasively imaging tissue properties, the method comprising:
  applying, with one or more coils, an ultra-short echo time (TE) pulse sequence in a Magnetic Resonance Imaging (MRI) system;
  acquiring, with one or more receivers, a complex $B_1^+ B_1^-$ quantity from an object following the application of the ultra-short TE pulse sequence, where $B_1^+$ is a complex amplitude of a transmit radio-frequency (RF) magnetic field and $B_1^-$ is a complex amplitude of a receive RF magnetic field;
  estimating, with a processor, one or more electrical properties including a permittivity and conductivity of the object using the complex amplitudes of the transmit RF magnetic field and the receive RF magnetic field;
  reconstructing an image of the permittivity and conductivity of the object using the estimated one or more electrical properties; and
  determining a tissue abnormality using the image of the permittivity and conductivity reconstructed using the one or more estimated electrical properties.

8. The method of claim 7, wherein the one or more electrical properties are estimated using the following:
For permittivity $$\varepsilon_r \approx -\frac{1}{\mu\varepsilon_0\omega^2}\text{Re}\left(\frac{\nabla^2 \sqrt{B_1^+ B_1^-}}{\sqrt{B_1^+ B_1^-}}\right)$$

For conductivity $$\sigma \approx -\frac{1}{\mu\omega}\text{Im}\left(\frac{\nabla^2 \sqrt{B_1^+ B_1^-}}{\sqrt{B_1^+ B_1^-}}\right)$$

Where $k^2$ is a complex wave vector, Re is the real component of the complex $B_1^+ B_1^-$ quantity, Im is the imaginary component of the complex $B_1^+ B_1^-$ quantity, $B_1^+$ is the complex amplitude of the transmit RF magnetic field at a given three dimensional location and $B_1^-$ is the complex amplitude of the receive RF magnetic field.

9. The method of claim 7, further comprising using as the ultra-short TE pulse sequence a rotating ultra-fast imaging sequence (RUFIS).

10. The method of claim 7, further comprising using as the ultra-short TE pulse sequence a pulse sequence having an echo time of below 1 millisecond, non-selective excitations of about 12 microseconds and incremental gradient updates.

11. The method of claim 7, further comprising calculating a $\sqrt{B_1^+ B_1^-}$ complex quantity to estimate the one or more electrical properties of the object.

12. A Magnetic Resonance Imaging (MRI) system comprising:
  an imaging portion comprising one or more coils, one or more transmitters, and one or more receivers, the imaging portion configured to generate an MRI transmit $B_1^+$ radio-frequency (RF) magnetic field using the one or more transmitters by applying an ultra-short echo time (TE) pulse sequence to the one or more coils, and acquire receive magnetic resonance (MR) $B_1^-$ RF data from an object using the one or more receivers, where $B_1^+$ is a complex amplitude of the transmit RF magnetic field and $B_1^-$ is a complex amplitude of the receive RF magnetic field; and
  a processing portion having an electrical properties estimation module configured to estimate electrical properties including a permittivity and conductivity of the object by acquiring a complex $B_1^+ B_1^-$ quantity resulting from the ultra-short TE pulse sequence and to reconstruct an image of the permittivity and conductivity of the object using the estimated permittivity and conductivity, wherein the image is reconstructed using a single MRI acquisition.

13. The MRI system of claim 12, wherein the electrical properties estimation module is further configured to estimate the one or more electrical properties using the following:
For permittivity $$\varepsilon_r \approx -\frac{1}{\mu\varepsilon_0\omega^2}\text{Re}\left(\frac{\nabla^2 \sqrt{B_1^+ B_1^-}}{\sqrt{B_1^+ B_1^-}}\right)$$

For conductivity $$\sigma \approx -\frac{1}{\mu\omega}\text{Im}\left(\frac{\nabla^2 \sqrt{B_1^+ B_1^-}}{\sqrt{B_1^+ B_1^-}}\right)$$

Where $k^2$ is a complex wave vector, Re is the real component of the complex $B_1^+ B_1^-$ quantity, Im is the imaginary component of the complex $B_1^+ B_1^-$ quantity, $B_1^+$ is the complex amplitude of the transmit RF magnetic field at a given three dimensional location and $B_1^-$ is the complex amplitude of the receive RF magnetic field.

14. The MRI system of claim 12, wherein the electrical properties estimation module is further configured to use as the ultra-short TE pulse sequence a rotating ultra-fast imaging sequence (RUFIS).

15. The MRI system of claim 12, wherein the electrical properties estimation module is further configured to use as the ultra-short TE pulse sequence a pulse sequence having an echo time of less than 1 millisecond, non-selective excitations of about 12 microseconds and incremental gradient updates.

16. The MRI system of claim 12, wherein the imaging portion is configured to generate an MRI transmit $B_1^+$ radio-frequency (RF) magnetic field using one or more transmitters by applying a single pulse sequence.

17. The MRI system of claim 12, wherein the imaging portion is configured to generate an MRI transmit $B_1^+$ radio-frequency (RF) magnetic field using a plurality of transmitters in a parallel transmit operation.

18. The MRI system of claim 12, wherein the imaging portion is configured to generate an MRI transmit $B_1^+$ radio-frequency (RF) magnetic field using one or more transmitters by applying a single pulse sequence for permittivity or conductivity reconstruction, wherein the single pulse sequence is gradient echo.

* * * * *